(12) United States Patent
Herschbach et al.

(10) Patent No.: US 9,606,237 B2
(45) Date of Patent: Mar. 28, 2017

(54) SPATIALLY CODED STRUCTURED LIGHT GENERATOR

(71) Applicant: IEE INTERNATIONAL ELECTRONICS & ENGINEERING S.A., Echternach (LU)

(72) Inventors: Norbert Herschbach, Medernach (LU); Jean-Luc Kaiser, Erpeldange (LU)

(73) Assignee: IEE International Electronics & Engineering S.A., Echternach (LU)

( * ) Notice: Subject to any disclaimer, the term of this patent is extended or adjusted under 35 U.S.C. 154(b) by 51 days.

(21) Appl. No.: 14/382,541

(22) PCT Filed: Mar. 1, 2013

(86) PCT No.: PCT/EP2013/054119
§ 371 (c)(1),
(2) Date: Sep. 2, 2014

(87) PCT Pub. No.: WO2013/127974
PCT Pub. Date: Sep. 6, 2013

(65) Prior Publication Data
US 2015/0301181 A1    Oct. 22, 2015

(30) Foreign Application Priority Data

Mar. 1, 2012 (LU) .......................... 91 950

(51) Int. Cl.
*G01S 17/89* (2006.01)
*G01S 7/481* (2006.01)
(Continued)

(52) U.S. Cl.
CPC .......... *G01S 17/89* (2013.01); *G01B 11/2513* (2013.01); *G01S 7/4815* (2013.01);
(Continued)

(58) Field of Classification Search
CPC ........ G01S 17/48; G01S 7/4815; G01S 17/89; G01B 11/2513; H01S 5/423; H01S 5/005
(Continued)

(56) References Cited

U.S. PATENT DOCUMENTS 5,838,428 A * 11/1998 Pipitone .................. G01S 17/89
356/3.09
5,995,650 A * 11/1999 Migdal .............. G01B 11/2518
345/419
(Continued)

FOREIGN PATENT DOCUMENTS

CN        1375744 A      10/2002
CN     101608906 A       12/2009
(Continued)

OTHER PUBLICATIONS

J. Salvi et al., "Pattern codification strategies in structured light systems", Pattern Recognition 37, 2004, pp. 827-849.
(Continued)

*Primary Examiner* — Sang Nguyen
(74) *Attorney, Agent, or Firm* — Reising Ethington P.C.

(57) ABSTRACT

A spatially coded structured light is generated by an array of laser diodes (1) in order to perform structured light triangulation. The laser diodes (1*a-c*) are VCSEL, where the light is emitted in the direction perpendicular to the semiconductor wafer surface. Plural such laser diodes (1*a-c*) are integrated monolithically to form an array (1). The position of the individual laser diodes in the array is coded spatially to form a non-regular unique pattern. The light output by the lasers is projected by a refractive or diffractive optical system (2) into the space to be monitored to form the structured light pattern. An object (5) to be investigated may be illuminated by the VCSEL array (1) and a camera (3) captures the frames. A processing unit (4) controls the power
(Continued)

of VCSEL (1a-c) and processes the data from the camera (3).

12 Claims, 2 Drawing Sheets

(51) Int. Cl.
  *G01S 17/48*   (2006.01)
  *H01S 5/42*   (2006.01)
  *G01B 11/25*   (2006.01)
  *H01S 5/00*   (2006.01)
  *H01S 5/183*   (2006.01)

(52) U.S. Cl.
  CPC .............. *G01S 17/48* (2013.01); *H01S 5/423* (2013.01); *H01S 5/005* (2013.01); *H01S 5/18394* (2013.01)

(58) Field of Classification Search
  USPC ................................ 356/601–614, 3.01, 4.01
  See application file for complete search history.

(56) References Cited

U.S. PATENT DOCUMENTS

| | | | |
|---|---|---|---|
| 6,798,438 B2 | 9/2004 | Beier et al. | |
| 6,974,964 B1* | 12/2005 | Wang | A61C 13/0004 250/559.22 |
| 7,146,036 B2* | 12/2006 | An Chang | G06K 9/2036 345/419 |
| 7,612,870 B2* | 11/2009 | Graff | G01B 11/24 348/262 |
| 8,089,498 B2 | 1/2012 | Sato et al. | |
| 8,531,650 B2* | 9/2013 | Feldkhun | G01B 11/2518 356/3.01 |
| 8,538,166 B2 | 9/2013 | Gordon et al. | |
| 2004/0101008 A1* | 5/2004 | Kurtz | H04N 9/3161 372/39 |
| 2007/0025612 A1* | 2/2007 | Iwasaki | G01B 11/25 382/154 |
| 2008/0118143 A1* | 5/2008 | Gordon | G01B 11/2513 382/154 |
| 2009/0281765 A1* | 11/2009 | Deliwala | A63F 13/06 702/150 |
| 2010/0177164 A1* | 7/2010 | Zalevsky | G01B 11/162 348/46 |
| 2012/0133954 A1* | 5/2012 | Takabayashi | G06T 7/0057 356/610 |
| 2012/0236288 A1* | 9/2012 | Stanley | G06F 3/017 356/4.01 |
| 2013/0044187 A1* | 2/2013 | Hammes | H04N 5/2256 348/46 |
| 2014/0267246 A1* | 9/2014 | Suzuki | G01B 11/2513 345/419 |

FOREIGN PATENT DOCUMENTS

| | | |
|---|---|---|
| CN | 101627280 A | 1/2010 |
| EP | 1410755 A1 | 4/2004 |
| EP | 1411607 A2 | 4/2004 |
| JP | 2008311499 A | 12/2008 |

OTHER PUBLICATIONS

International Search Report issued Jun. 21, 2013 re: PCT/EP2013/054119.

Chinese Office Action in Chinese with English translation corresponding to CN application No. 201380012119.4, dated May 31, 2016, 15 pages.

* cited by examiner

SPATIALLY CODED STRUCTURED LIGHT GENERATOR

TECHNICAL FIELD

The present invention generally relates to the field of 3D mapping by structured light triangulation. More specifically, the invention relates to a spatially coded structured light generator based on an array of monolithically integrated surface emitting laser diodes.

BACKGROUND ART 3D mapping of a scene by structured light triangulation comprises illuminating the scene with a light pattern and observing the illuminated scene with a camera whose optical axis is offset from the illumination source. If a given ray from the illumination intersects a reflective object, an image of this ray will by formed on the camera. The location of the image of this ray together with knowledge about the exact geometry of illumination-imaging setup allows the determination of the relative position of the intersection between the light ray and the object. This supposes that one knows which ray of the structured light pattern intersected the object. Finding the ray of the pattern, which corresponds to a point in the image, is often called the correspondence problem.

There are many strategies to solve the correspondence problem which, according to Salvi et al. (J. Salvi et al., Pattern codification strategies in structured light systems, Pattern Recognition 37 (2004) 827-849), can be categorized as follows:
   Time-multiplexing
   Direct codification
   Spatial neighbourhood The time-multiplexing strategy comprises temporally coding the structured light pattern. A sequence of different patterns is projected and imaged one after the other. The 3D-map can be constructed by analyzing the complete sequence of images.

In the direct codification strategy, the correspondence problem is solved by coding the ray itself in a unique manner, mostly by colour (wavelength). This strategy thus requires the acquisition of a reference frame, since the scene is not uniform in spectral reflectivity. Furthermore the optical sub-system becomes quite complex. A broad-spectrum light has to be emitted and the imaging device needs colour (wavelength) measurement ability.

The spatial neighbourhood strategy solves the correspondence problem by coding the neighbourhood of a ray in a unique manner. By observing the image of the ray as well as the neighbourhood of this image, the ray can be identified. One particularly interesting implementation of this strategy involves a structured light pattern formed by a pseudo-random noise pattern of dots. According to the current state of the art, this pattern is created by processing the output of a laser with diffractive optical components (computer generated holograms for example). In order to make such a diffractive structured light triangulation robust with respect to sunlight, one has to make sure that there is sufficient contrast of the active illumination with respect to background light to discern the structured light pattern in the image frame captured by the video camera. There are certain parameters of the system, which can be optimized, such as the spectral range in which the camera is sensitive, however ultimately the only solution is to increase the intensity of the pattern. This can be obtained by increasing the power of the single laser or by combining the output from more than one laser by some beam-combining techniques. The first approach is limited, with current single emitter laser devices one can not reach an intensity which is sufficient to be robust with respect to sunlight. The second approach leads to a substantially increased complexity of the optical sub-system.

BRIEF SUMMARY

Remote sensors are considered, which construct a 3D map of a scene with a field of view of a few tens of degrees and with object distances up to several tens of meters. Structured light triangulation is one of the preferred methods to generate a 3D map of a scene. Systems which have been implemented or described in the literature however miss at least one of the two following basic requirements:
   Robustness to sunlight. The system should be able to construct a 3D map of a scene illuminated by the sun.
   The 3D map of the scene should be constructed from a single frame capture of the image of the structured light illuminated scene.

The system described herein shall overcome these limitations and fulfil both basic requirements, while still being based on a simple optical sub-system.

A spatially coded structured light is generated by an array of laser diodes. The laser diodes are of the surface-emitting type, where the light is emitted in the direction perpendicular to the semiconductor wafer surface. Plural such laser diodes are integrated monolithically to form an array. The position of the individual laser diodes in the array is coded spatially to form a non-regular unique pattern. The light output by the lasers is projected by a refractive or diffractive optical system into the space to be monitored to form the structured light pattern.

BRIEF DESCRIPTION OF THE DRAWINGS

A preferred embodiment of the invention will now be described, by way of example, with reference to the accompanying drawings, in which.

DESCRIPTION OF PREFERRED EMBODIMENTS

Figure 1:
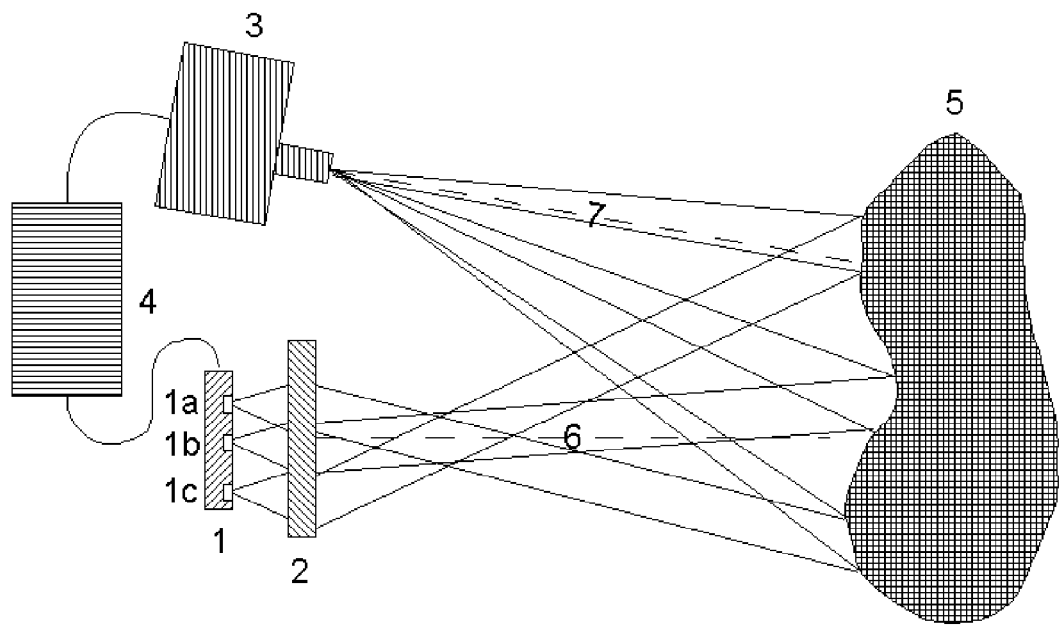
FIG. 1 is a schematic illustration of a setup for structured light triangulation.

A configuration for structured light triangulation is shown schematically in FIG. 1. The reference numbers indicate:
1: an array of monolithically integrated surface emitting laser diodes
1a-1c: individual laser diodes
2: projection optics
3: camera
4: power, control and processing unit
5: object in the scene
6: illumination optical axis
7: camera optical axis.

The unit 4 powers the array of laser diodes. The projection optics 2 projects the light emitted by the individual laser diodes, forming the spatially coded structured light pattern in the scene. The unit 4 starts the acquisition of a frame, and retrieves the data from the camera 3, once a complete frame has been captured. The unit 4 processes these data, and constructs the 3D map of the scene.

Figure 2:
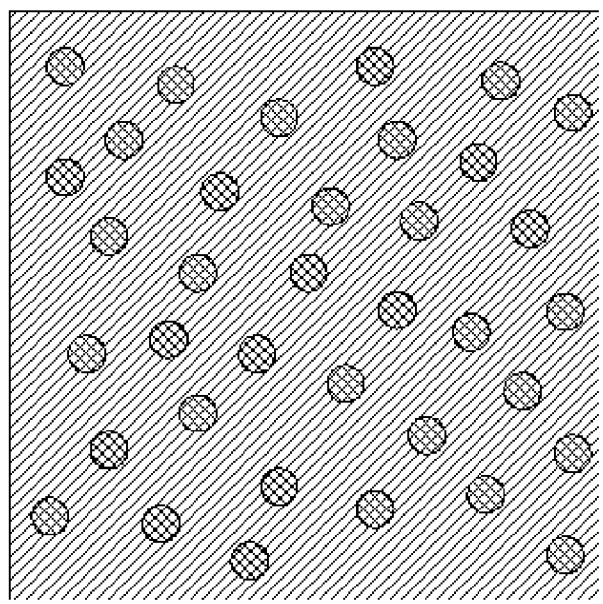
FIG. 2 is an illustration of a array of monolithically integrated surface emitting laser diodes according to a first example.
Figure 3:
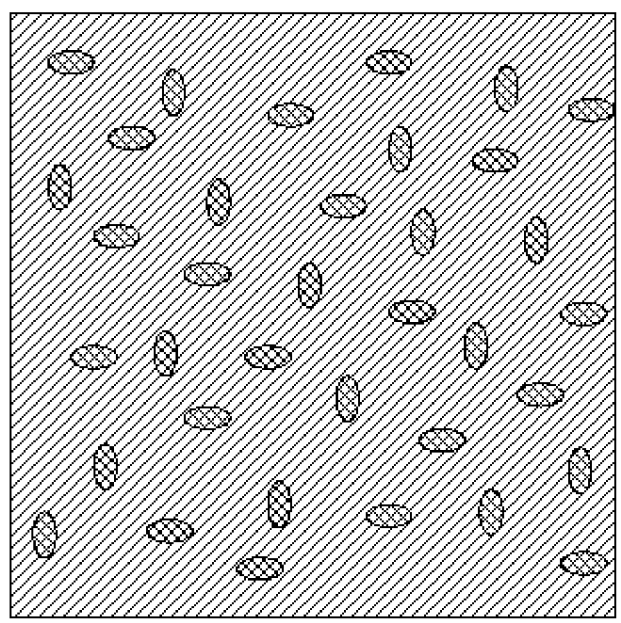
FIG. 3 is an illustration of a array of monolithically integrated surface emitting laser diodes according to a second example.

The array of monolithically integrated surface emitting laser diodes is manufactured according to the standard processes for such lasers, except that the masks used to process the wafers have a geometry such that the spatially coded pattern of laser diodes is formed. After dicing an operational module of such an array is obtained. A top view of such a module is shown schematically in FIG. 2 where the position of the individual lasers is indicated by circles. The circles do not represent the near-field output of the laser diodes. Near-field outputs without rotational symmetry are possible, which increases the information content of the spatial coding of the structured light pattern. This is illustrated in FIG. 3, where two orthogonal orientations of an elliptical near-field output of the laser diodes are considered.

The invention allows the construction of a structured light triangulation system, whose optical subsystem is of particular simplicity. It comprises a monolithical array of surface emitting laser diodes whose output is imaged by refractive and/or diffractive optical elements on a scene and a camera for capturing an image of this illuminated scene.

The positions of the individual laser diodes within the monolithical array represent a spatial code in the form of a non-regular unique pattern and the 3D map of the scene is obtained from the information contained by a single frame captured by the camera.

The structured light pattern is created from the output of many laser diodes, which are monolithically integrated. The power scaling to obtain the required sunlight robustness is thus straight-forward. Commercially available arrays of vertical cavity surface emitting lasers (VCSEL) have already been demonstrated to give sufficient power levels.

The invention claimed is:

1. A structured light 3D triangulation system, comprising:
   a spatially coded structured light generator comprising an array of monolithically integrated surface emitting laser diodes, wherein, the individual laser diodes in the array are arranged on a wafer level to generate a spatially coded structured light field that is formed in a scene by the projection of the emission of the array of laser diodes onto a 3D object in said scene and reflection of the emission from said 3D object to form a spatially coded structured light pattern of said scene; and
   a camera arranged for capturing an image of the spatially coded structured light pattern, and wherein a 3D map of said scene is constructed using structured light triangulation based on the captured image of the spatially coded structured light pattern.

2. The structured light 3D triangulation system as claimed in claim 1, wherein the spatial encoding is achieved by the positions of the individual laser diodes, the positions forming a non-regular unique pattern.

3. The structured light 3D triangulation system as claimed in claim 1, wherein the information content of the spatially coded pattern is provided or increased by giving different shapes to the output of the laser diodes.

4. The structured light 3D triangulation system as claimed in claim 3, wherein a shaping of the laser diode outputs is achieved by giving different shapes or sizes to the output aperture of the laser diodes.

5. The structured light 3D triangulation system as claimed in claim 1, wherein the information content of the spatially coded pattern is provided or increased by giving different spot sizes to the output of the laser diodes.

6. The structured light 3D triangulation system as claimed in claim 5, wherein the realization of different spot sizes of the laser diode outputs is achieved by giving different shapes or sizes to the output aperture of the laser diodes.

7. The structured light 3D triangulation system as claimed in claim 1, wherein the laser diode array is implemented in Vertical Cavity Surface Emitting Laser (VCSEL) technology.

8. The structured light 3D triangulation system according to claim 1, further comprising at least one of a refractive, diffractive or reflective optical element configured for projecting said structured light field onto said scene and 3D object.

9. The structured light 3D triangulation system as claimed in claim 1, further comprising a processing unit configured to retrieve image data from the camera as a single frame.

10. The structured light 3D triangulation system as claimed in claim 9, wherein said processing unit is configured to construct a 3D map of said scene from the single frame.

11. The structured light 3D triangulation system as claimed in claim 9, wherein said processing unit also powers and controls the array of laser diodes.

12. The structured light 3D triangulation system as claimed in claim 1, wherein said structured light 3D triangulation system is configured to construct a 3D map of said scene while said scene is illuminated by the sun.

* * * * *